United States Patent [19]

Couch et al.

[11] 4,219,152

[45] Aug. 26, 1980

[54] DUAL THRESHOLD COMPARATOR CIRCUIT

[75] Inventors: William D. Couch; Richard G. Minor, both of Raleigh, N.C.

[73] Assignee: International Business Machines Corp., Armonk, N.Y.

[21] Appl. No.: 13,572

[22] Filed: Feb. 21, 1979

[51] Int. Cl.² .................. G06K 7/14; H03K 9/02; G11B 5/09
[52] U.S. Cl. .................. 235/463; 307/351; 328/146; 329/109; 360/40
[58] Field of Search .......... 235/463, 462, 464, 466, 235/467, 449, 450; 307/351; 328/146; 329/104, 106, 109; 360/32, 39, 40, 44

[56] References Cited

U.S. PATENT DOCUMENTS

| | | | |
|---|---|---|---|
| 3,949,313 | 4/1976 | Tomada et al. | 235/463 |
| 4,086,477 | 4/1978 | Cowardin et al. | 235/464 |
| 4,125,765 | 11/1978 | Cowardin et al. | 235/463 |
| 4,141,494 | 2/1979 | Fisher | 235/493 |
| 4,158,435 | 6/1979 | Nakanishi et al. | 235/463 |

Primary Examiner—Daryl W. Cook
Attorney, Agent, or Firm—Gerald R. Woods

[57] ABSTRACT

A dual threshold comparator circuit includes a comparator amplifier for comparing an analog input signal to a threshold waveform. The threshold waveform is generated in a circuit which includes positive and negative peak detector circuits and a slope detector circuit, all of which are connected to the analog signal source. A voltage divider is connected across the output of the positive and negative peak detector circuits. The threshold input to the comparator amplifier is connected to the common junction of first and second serially-connected impedances in the voltage divider. At the beginning of a particular half cycle of the analog input signal, the voltage across the voltage divider is equal to the difference of the most recent positive and negative peak voltages. The slope detector alters the effective impedances in the voltage divider to cause the threshold voltage to be equal to 25 or 75% of the total difference voltage, depending upon the slope of the analog signal.

11 Claims, 6 Drawing Figures

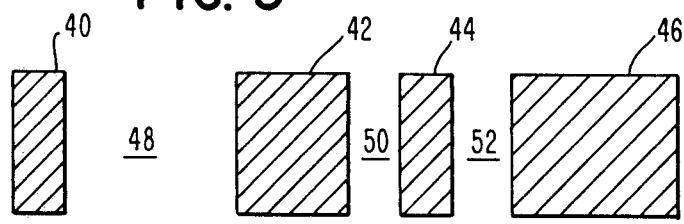
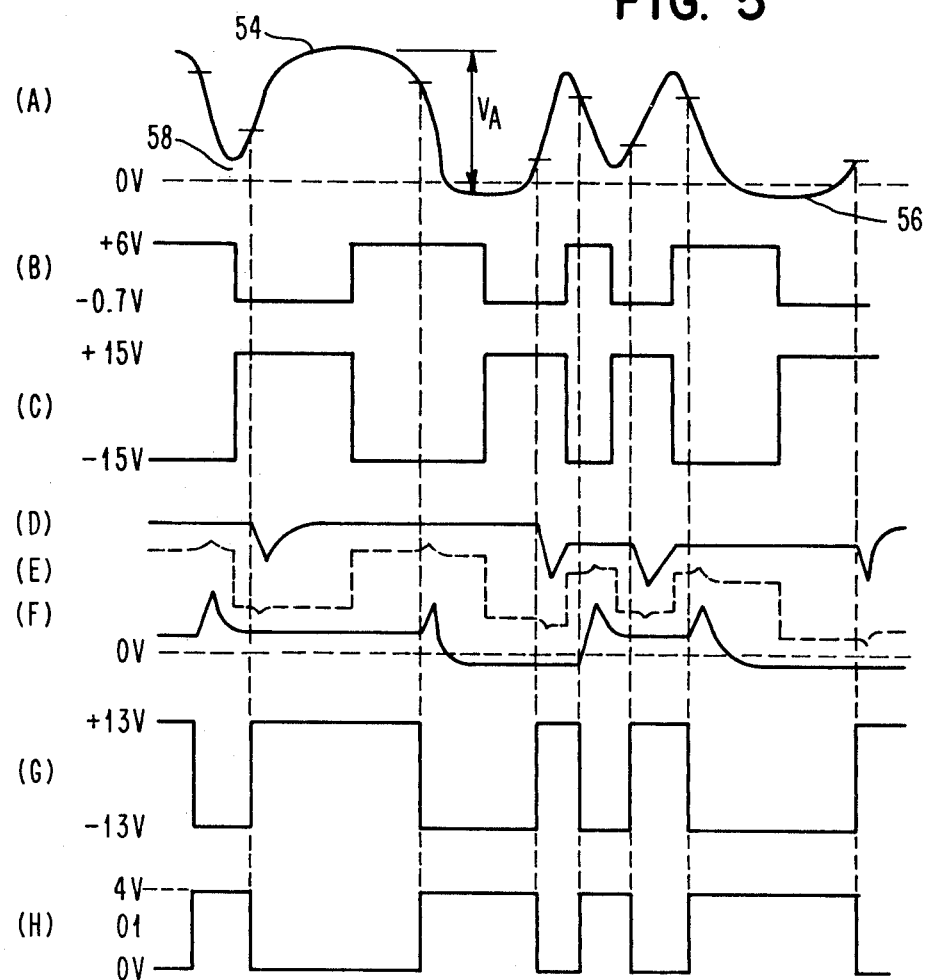

DUAL THRESHOLD COMPARATOR CIRCUIT

TECHNICAL FIELD

The present invention relates to voltage comparator circuits and more particularly to a comparator circuit utilizing adaptively derived dual threshold voltages.

BACKGROUND

A number of items being marketed in supermarkets and other retail establishments are provided with machine-readable labels which include product-identifying information in bar code format. The most well known of these bar code labels is the Universal Product Code (UPC) label. Viewed in its entirety, a UPC label appears to be a series of black bars of varying widths. In fact, different parts of the label serve different functions. The left and right edges of the label are each defined by a pair of relatively narrow guard bars. The label includes a center separator, consisting of two relatively narrow black bars and three white spaces, which divides the label into left and right halves. Each half of the label includes a number of groups of bars with each group consisting of two black bars and two white bars representing a single numeric character. Different numeric characters are identified by making the white and black bars in a group of different relative widths. The absolute widths of the bars is immaterial. Only their relative widths are important in decoding the label.

To decode the label, the relative widths of the white and black bars in the label are measured. One method and circuit for performing the decoding operation is disclosed in U.S. Pat. No. 4,086,477, issued Apr. 25, 1978 and assigned to the assignee of the present invention.

The subject patent assumes as its starting point that a digitized pulse stream has been generated in which the positive-going square wave pulses represent the widths of UPC label bars of one color while the negative-going square wave pulses represent the widths of the bars of the other color.

The present invention relates to circuitry for deriving the digitized pulse stream to be processed in accordance with the technique disclosed in the subject patent.

In one application, a UPC label is read by a hand held optical wand which an operator moves across the UPC label. The wand includes a scanning tip with a photosensitive element which responds to the alternating white and black bars of the label by generating positive-going and negative-going voltages, respectively. The resulting output signal is a train of nearly-sinusoidal pulses of widely varying amplitudes and widths.

The nearly-sinusoidal shape of the pulses is, in part, a result of the fact that the photosensitive element in the hand-held wand detects light reflected from both white and black bars on the label in changing proportions as the wand moves across the boundary between adjacent bars. As a specific example, assume that a wand above a black bar is approaching the boundary with an adjacent white bar. While the wand is still over the black bar, a minimal amount of light will be reflected to the photosensitive element, causing a minimum voltage to be generated. After the wand has crossed the boundary and is located above the white bar, a maximum amount of light will be reflected to the photosensitive element, causing a maximum voltage to be generated. But as the wand is passing over the boundary, it will "see" changing amounts of both the black bar and the white bar so that the voltages produced will increase gradually from the minimum to the maximum level.

As indicated above, the photosensitive element produces minimum and maximum voltages when it receives reflected light only from a black bar or only from a white bar, respectively. This is an ideal situation which cannot always be realized when small UPC labels are being read. The narrowest white or black bar which is permitted by current standards is 0.008" or 0.2 MM in width. Available optical wands have a field of view which is greater than this dimension. When such a wand is centered above a bar of minimum width, the photosensitive element will receive reflected light not only from that bar but also from flanking bars. More specifically, a wand centered above a narrow black bar will receive reflected light both from the black bar and from the two white bars on either side of the black bar. The voltage which is produced will naturally be somewhat higher than the voltage produced by a wand centered above a broader black bar.

The inverse of the above-described situation holds true, of course, for a wand centered above a white bar of minimum width. Because the wand will detect light reflected not only from the narrow white bar but from the two flanking black bars as well, the voltage which is produced will be somewhat less than the maximum possible voltage.

To generate a train of rectangular pulses, the transition points at which the optical wand passes the boundaries between adjacent white and black bars must be detected. A simple way to detect the transition points is to compare the wand voltage with a fixed threshold voltage. Each time the wand voltage increases above or falls below the fixed threshold voltage, it is assumed that the wand has passed a boundary between adjacent white and black bars.

This arrangement may not always function suitably because the minimum and maximum voltages generated by a photosensitive element will shift as a function of ambient lighting conditions and label quality. A wand which is used to read a label under bright lights will generate a waveform having higher voltages than the same wand used to read the same label in a dimly lighted store. If the threshold voltage is fixed, shifts in the level of the waveform due to changing ambient conditions will cause transitions to be detected before or after they actually occur. Label reading errors will result. In the most extreme case, a waveform generated under bright light conditions might have a minimum voltage exceeding the fixed threshold voltage so that no transitions at all would be detected.

Similarly, a dark label having a greyish background, will reflect considerably less light than a light label having a pure white background. Consequently, the voltage obtained by reading a dark label will be shifted negative relative to voltage obtained upon reading on a lighter label, even if both labels are read at exactly the same ambient lighting level.

Obviously, it is desirable that the label reading process be substantially independent of the effects of ambient lighting conditions and label quality.

Some of the problems of the fixed threshold system discussed above are overcome in an adaptive system in which a threshold voltage is set midway between detected minimum and maximum voltages. While the use of an adaptive threshold ameliorates the problem of waveform level shifting due to changes in ambient lighting conditions or label print quality, it does not provide a solution to the problem of cycle to cycle variations in peak voltages as a result of reading narrow bars. If an extremely narrow bar is read after a narrow bar of the opposite color and a wide bar of the same color, the resulting threshold voltage will be too great relative to the current peak value, resulting in a late transition detection.

SUMMARY

To overcome the problems posed by prior art threshold circuits, the present invention is a circuit for generating first and second adaptively-derived threshold voltages and for comparing an input signal to those threshold voltages in order to detect transitions. The circuit includes positive and negative peak detector circuits for providing output signals equal to the positive and negative peak voltages of an input signal. Each of the peak detector circuits includes a reset input. The circuit also has a slope detector circuit connected to the source of the input signal for providing a bilevel output voltage having a level dependent upon the slope of the input signal. An adaptive dual threshold circuit has first and second inputs from the positive and negative detector circuits and a common output. The dual threshold circuit includes a first impedance connecting the first input to the common output and a second impedance connecting the second input to the common output. The effective value of one of the impedances is changed as a function of the output voltage produced by the slope detector circuit. Comparator means compares the analog input signal to the output signal from the adaptive dual threshold circuit. Means are also provided for applying the output of the comparator means to the reset inputs of the peak detector circuits to reset each peak detector when the comparator output changes to a state opposite the peak detector state.

BRIEF DESCRIPTION OF THE DRAWINGS

While the specification concludes with claims particularly pointing out and distinctly claiming that which is regarded as the present invention, further details of a preferred embodiment of the invention may be more readily ascertained from the following detailed description when read in conjunction with the accompanying drawings, wherein:

FIG. 3 is an enlarged view of a section of a UPC label and will be used to explain the operation of the present invention;

FIG. 5 shows waveforms which are generated during operation of the circuit.

PREFERRED EMBODIMENT

Figure 1:
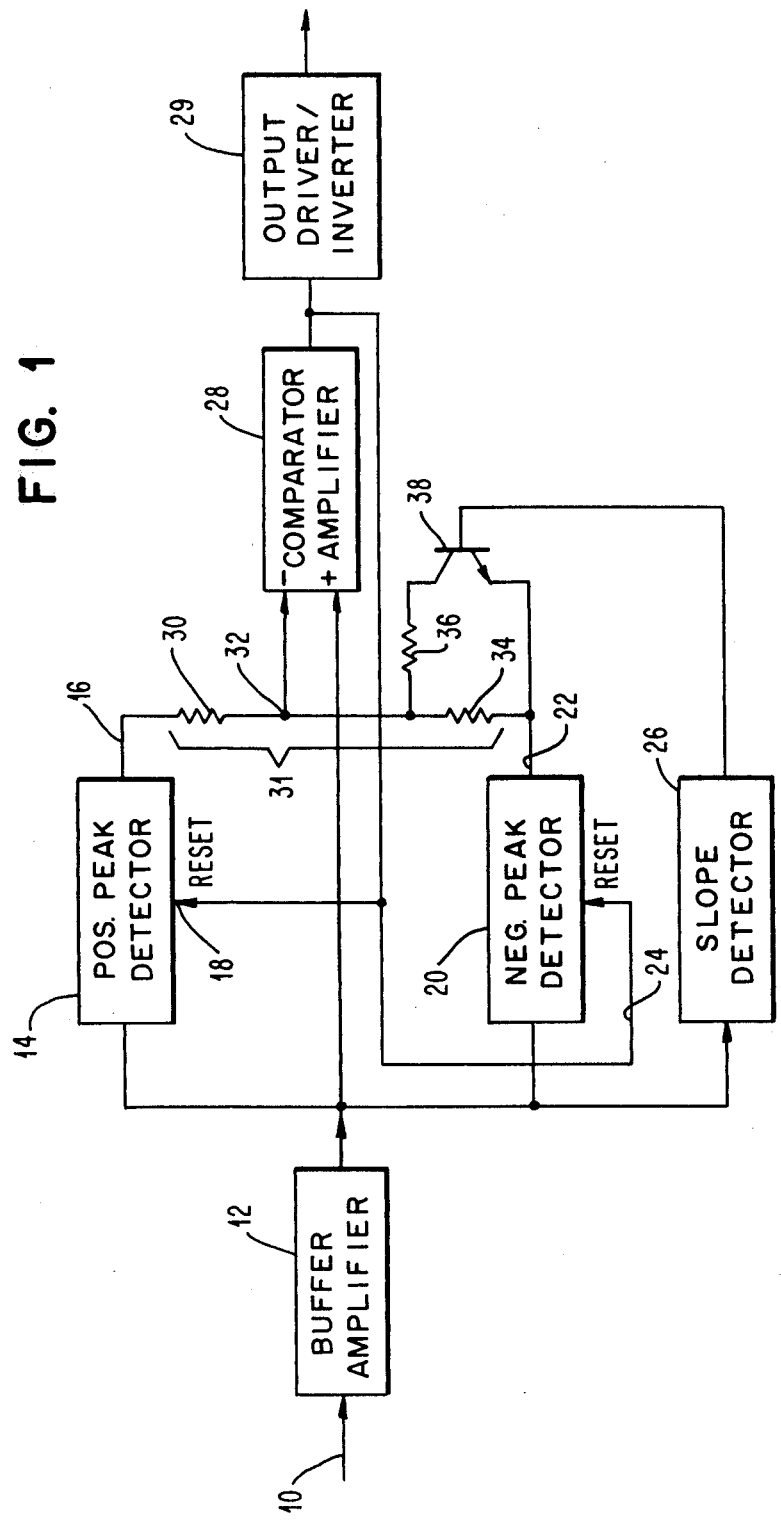
FIG. 1 is a general block diagram of a circuit constructed in accordance with the present invention.

Referring to FIG. 1, an analog signal generated by a hand-held wand is applied to an input 10 to a buffer amplifier 12. Buffer amplifier 12 amplifies the analog waveform and shifts the waveform relative to a reference voltage such as zero voltage or ground. The analog waveform at the output of buffer amplifier 12 is applied to a number of circuits, including a positive peak detector circuit 14 which detects the peak voltage during positive-going excursions of the analog waveform and holds that voltage at its output 16 until a reset signal is applied at a reset input 18.

A negative peak detector circuit 20 performs the same function with respect to negative-going excursions in the ananlog waveform. Circuit 20 detects the peak negative voltage and holds that voltage at its output 22 until a reset signal is received at a reset input 24.

The analog waveform is also applied to a slope detector circuit 26 which provides a first, high level voltage at its output when the applied analog signal has a positive slope or is increasing. The slope detector circuit 26 provides a second, low level voltage at its output when the analog signal slope is negative.

The output of buffer amplifier 12 is also applied directly to the positive input terminal of a comparator amplifier 28 which compares the analog signal to a threshold voltage applied at its negative input terminal. The threshold voltage is generated in a circuit which includes a voltage divider 31 having a first impedance or resistor 30 connected between the output 16 of detector 14 and a common output junction 32. The voltage divider 31 also includes a second impedance 34 connected between output 22 of the detector 20 and the common junction 32. A third impedance 36 is connected in parallel with impedance 34 through a transistor 38. The transistor 38 is switched off or on as a function of the output of slope detector circuit 26. When the analog input signal has a negative slope, transistor 38 is switched off to remove resistor 36 from the voltage divider circuit. When the analog signal has a positive slope, transistor 38 is switched on to insert resistance 36 into the voltage divider circuit.

Assuming for purposes of illustration that the voltages at the outputs of peak detector circuits 14 and 20 are fixed, switching transistor 38 into and out of the voltage divider circuit has the effect of shifting the voltage at the common junction 32 and thus at the negative input to comparator amplifier 28. More specifically, when transistor 38 is non-conducting, the voltage at point 32 is higher than it is when transistor 38 is conducting.

The output of comparator amplifier 28 is a bi-level signal which is applied both to an output driver/inverter circuit 29 and to the reset inputs of the peak detectors 14 and 20.

Figure 2:
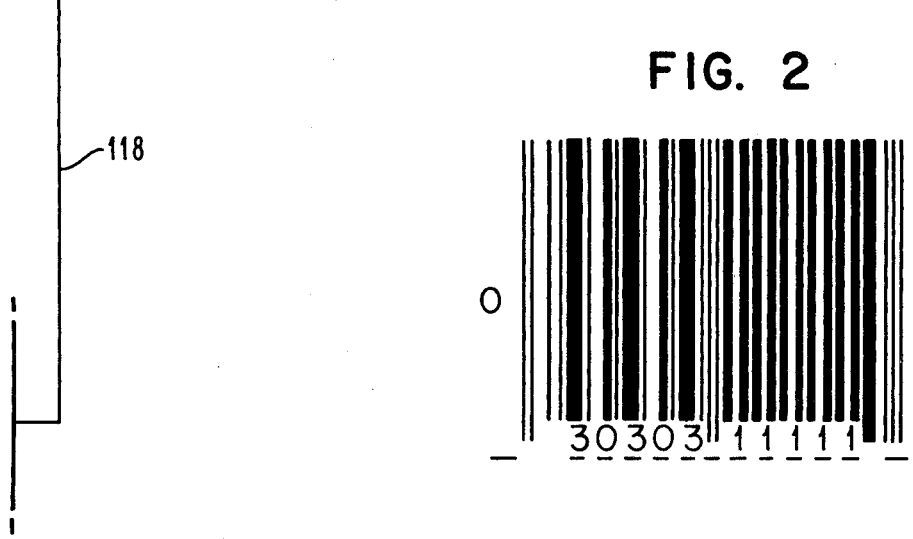
FIG. 2 shows a representative, large Universal Product Code (UPC) label.

The operation of the circuit shown in block diagram form will be discussed only after the circuit is described in more detail. Before the circuit is described in detail, brief reference should be made to the representative UPC label shown in FIG. 2. The variations in relative widths of black bars and intervening white bars can be seen clearly. While some UPC labels are as large as the illustrated label, most are considerably smaller with the widths of the bars being reduced in proportion to the size of the overall label. It should be appreciated that the narrowest bar which must be detected will be much thinner on a small UPC label than on the oversized label shown in FIG. 2.

Referring briefly to FIG. 3 and FIG. 5A, when a hand-held scanner is moved from left to right across a UPC label, detected black bars cause negative-going voltage peaks to be generated while intervening white bars cause positive-going voltage peaks to be generated. The duration and magnitude of the voltage excursions vary with the width of the bar being traversed. More specifically, FIG. 3 shows a small segment of a UPC label consisting of four black bars 40, 42, 44 and 46 of varying widths separated by three white bars 48, 50 and 52, also of varying widths. When an optical scanner is located above a relatively broad bar such as white bar 48 or black bar 46, the scanner's photosensitive element is responsive primarily to light reflected from that bar. As a result, a maximum positive or negative peak voltage is generated. More specifically, a relatively flat positive peak 54 is generated as the scanner traverses the broad white bar 48 while a relatively flat negative peak 56 is generated as the scanner traverses the broad black bar 46. When the scanner is centered above a narrow bar, such as narrow black bar 40, its photosensitive element detects light reflected not only from bar 40 but also the flanking white bars. As a consequence, the peak negative voltage 58 generated is less than the maximum negative voltage. The function of the circuit which will now be described with reference to FIG. 4 is to determine when the scanner has crossed the boundary from a bar of one color to a bar of the other color notwithstanding the fact that the shape and magnitude of the analog peaks vary as the label is traversed.

Figure 4B:
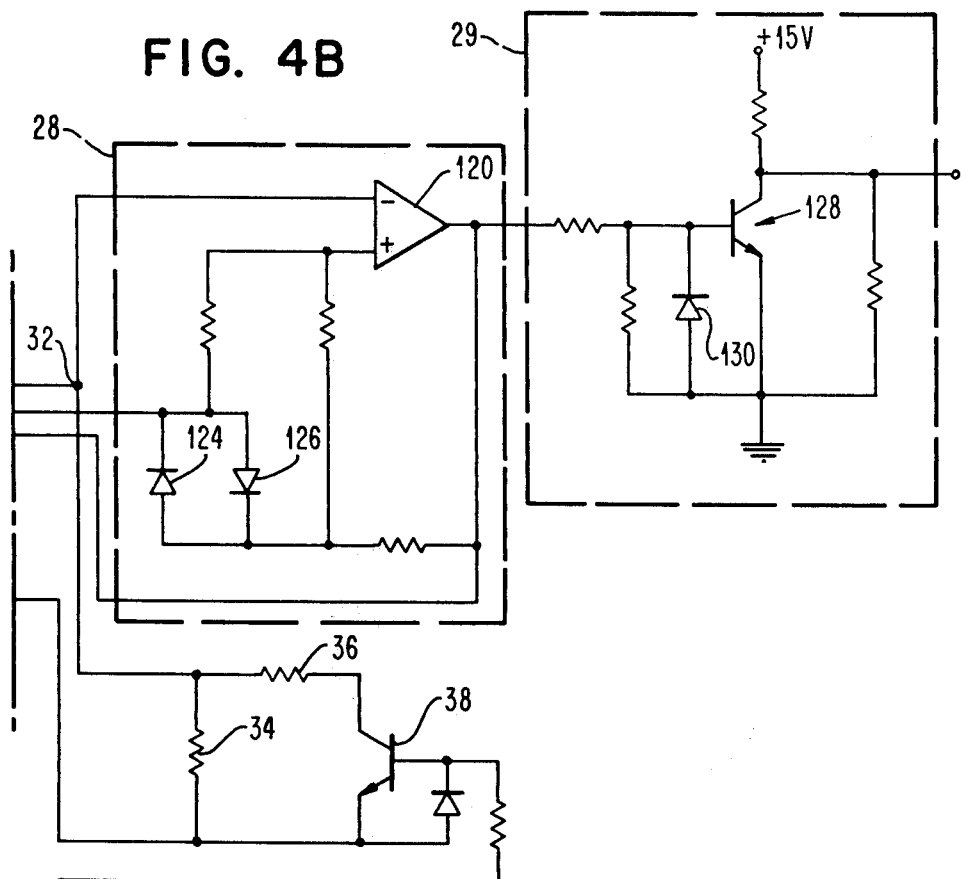
FIG. 4, consisting of FIGS. 4A and 4B taken together, is a detailed schematic diagram of the circuit shown in block diagram form in FIG. 1.
Figure 4A:
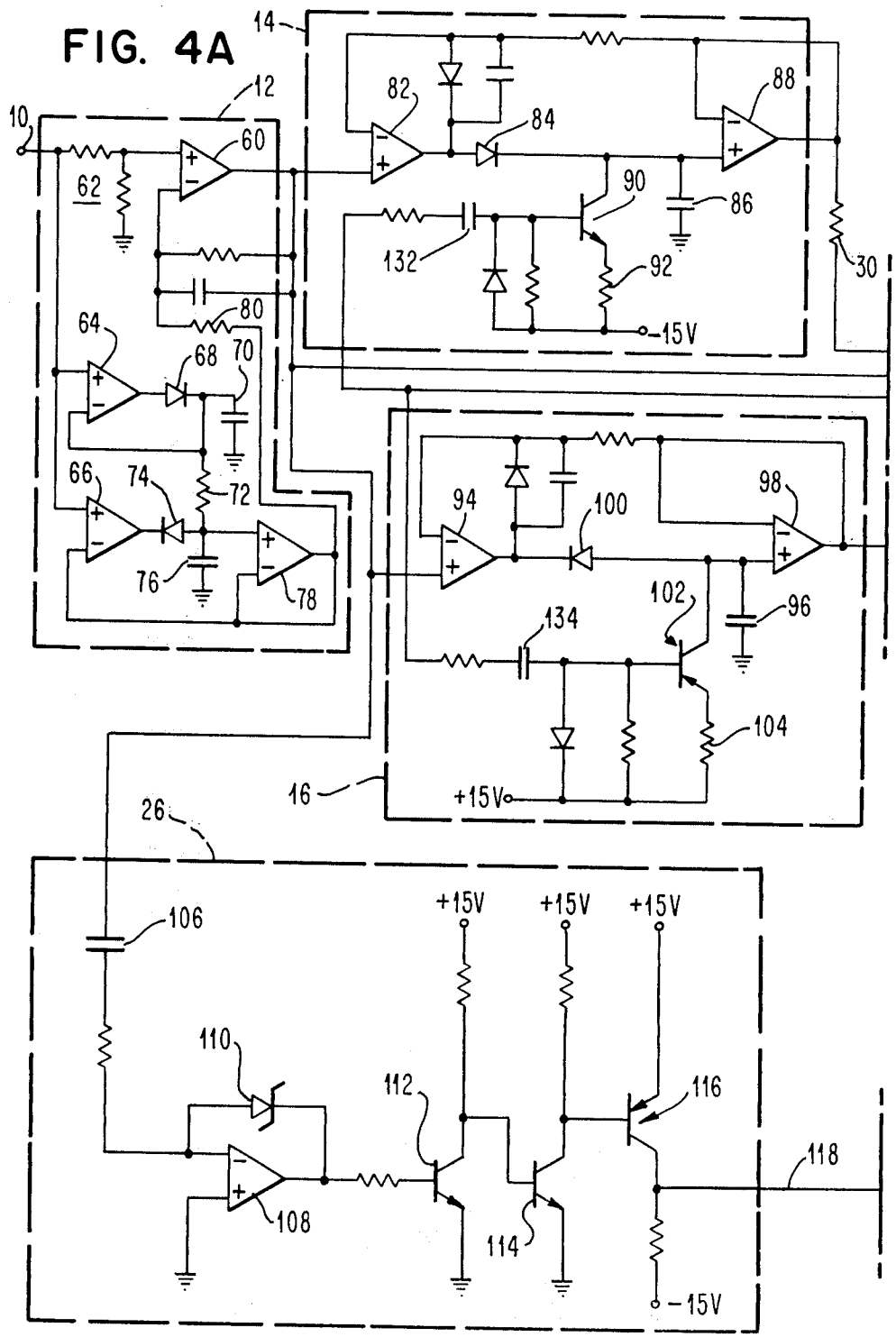

FIGS. 4A and 4B are aligned horizontally with the former figure being to the left of the latter. Horizontal lines which are shown as terminating at the right side of FIG. 4A actually continue into lines which begin at the left side of FIG. 4B. The analog signal generated by a hand-held scanner is applied at input 10 to the buffer amplifier 12. The analog signal is applied to the positive input of amplifier 60 through a voltage divider circuit 62 and to a pair of amplifiers 64 and 66, which are employed to provide negative DC level offset compensation. More specifically, amplifier 64, in combination with diode 68 and capacitor 70, acts as a positive peak detector circuit which causes a peak voltage to be maintained at the upper end of a resistance 72. Amplifier 66, in combination with diode 74 and capacitor 76, acts as a negative peak detector circuit which causes a negative peak voltage to be maintained at the lower end of a resistor 72 and at the positive input terminal of an amplifier 78. Resistor 72 is relatively large. The time constant of resistor 72 and capacitor 76 is great enough to allow capacitor 76 to partially discharge between successive analog waveform cycles. The negative peak voltage which is held at the junction of capacitor 76 and resistor 72 is applied through amplifier 78 and a resistor 80 to the negative input to amplifier 60 to shift the signal at the output of amplifier 60 by an amount proportional to the applied negative input.

The waveform which appears on the output of amplifier 60 is an amplified and level shifted version of the waveform originally applied to input terminal 10. The relative widths of the positive and negative excursions and their relative amplitudes are not intended to be significantly affected by buffer amplifier 12. The analog signal at the output of amplifier 12 is applied to an amplifier 82 in a positive peak detector circuit 14. The output circuit of amplifier 82 includes a diode 84 leading to a capacitor 86. The voltage on capacitor 86 is applied to a unity gain high impedance buffer amplifier 88. A controllable discharge path for capacitor 86 is provided through a transistor 90 having a resistor 92 connected directly to a source of negative voltage. During positive-going analog signal excursions, the voltage at the output of amplifier 82 charges capacitor 86. Since transistor 90 is normally non-conductive, no discharge path normally exists for capacitor 86. When the input voltage passes its positive peak and starts to decrease, diode 84 becomes back biased, holding capacitor 86 at the positive peak voltage.

The analog signal at the output of buffer amplifier 12 is similarly applied to an amplifier 94 in the negative peak detector circuit 16. This circuit is similar to the positive peak detector circuit 14 in that it includes a holding capacitor 96, a unity gain output buffer amplifier 98 and a diode 100 in series with the input amplifier 94. A transistor 102, in combination with an emitter resistance 104, provides a controllable discharge path for the holding capacitor 96.

The differences between the positive and negative peak detector circuits are in the orientation of the amplifier output diode and in the polarity of the power supplies connected to the discharge circuits. In the negative peak detector circuit 16, the power supply provides a positive voltage while the diode 100 is reversed relative to the diode 84 in the positive peak detector circuit. Diode 100 conducts only when a negative analog signal is applied at the input to amplifier 94. When diode 100 conducts, the voltage at the upper terminal of holding capacitor 96 is driven toward the maximum negative analog voltage. When the analog signal reaches its maximum negative value and starts to go positive, diode 100 becomes back biased to isolate the holding capacitor 96 from the analog signal. Capacitor 96 holds the maximum negative voltage until it is discharged by driving transistor 102 into a conductive state.

The analog signal at the output of buffer amplifier 12 is applied through a DC blocking capacitor 106 in series with a high gain amplifier 108 in the slope detector circuit 26. The AC component of the analog signal is applied to the negative input terminal of amplifier 108, while the positive input terminal is held at ground, causing the amplifier output signal to be inverted relative to the input signal. The feedback path for amplifier 108 includes a Zener diode 110 which serves as a limiter to prevent the amplifier from going into saturation or cutoff.

Because amplifier 108 is an extremely high gain amplifier, it responds almost instantaneously to changes in the slope of the applied analog signal. When the slope changes from negative to positive, the output of amplifier 108 drops quickly to a level determined by the forward voltage drop across Zener diode 110. Conversely, when the slope of the applied analog signal goes from positive to negative, the amplifier output rises to a positive level limited by the reverse breakdown voltage of Zener diode 110.

The signal on the output of amplifier 108 is applied to a level shifting circuit including a first transistor 112 having a grounded emitter and a collector which is connected directly to the base of a second transistor 114, also having a grounded emitter. The collector of transistor 114 is connected directly to the base of still another transistor 116 which acts as an inverter to provide a slope-representing signal on output 118 having the same sense as the slope currently being detected. The circuit including transistor 116 also changes the limits of the output voltage from those established by Zener diode 110 to plus and minus 15 volts to provide switching voltages for transistor 38 in the voltage divider circuit including resistors 30, 34 and 36.

In a preferred embodiment of the invention, the value of resistor 34 is preferably three times the value of resistor 30 while the value of resistor 36 is preferably equal to 0.37 the value of resistor 30. When the applied analog signal has a negative slope, transistor 38 is non-conducting and the impedance ratio of resistor 30 to resistor 34 is one to three. However, when the applied analog signal has a positive slope and transistor 38 is conducting, the relative ratios are reversed. This is, the impedance ratio of resistor 30 to the combined effective resistances of resistors 34 and 36 is three to one. Thus, assuming fixed positive and negative voltages on the outputs of the positive and negative peak detector circuits, respectively, the voltage at the common point 32 is equal to 25% of the difference in peak voltages when the applied analog signal has a positive slope and 50–75% of the difference in peak voltages while the analog signal has a negative slope. The bi-level voltage at common point 32 represents the dual threshold voltage which is applied to the negative input of an operational amplifier 120 in the comparator amplifier circuit 28.

The analog signal at the output of buffer amplifier 12 is applied to the positive input terminal of amplifier 120 through a hysteresis circuit including a pair of parallel, reversed diodes 124 and 126. When the output of operational amplifier 120 changes state, indicating the analog signal has passed a threshold level, a fixed voltage drop is established across one of the diodes 124 and 126. The voltage is additive to the applied analog voltage and effectively boosts the analog signal beyond the threshold level. This boosting action reduces the chances that a noise voltage will momentarily drive the analog signal to a pre-threshold value when the analog signal is passing through the transition region.

The signal appearing on the output of amplifier 120 is a squared train of pulses, the widths of which correspond to the widths of bars in the label being scanned. This signal is used to reset the peak detector circuits 14 and 16 and is applied to driver/inverter circuit 29. Circuit 29 converts the signal to T²L compatible levels while inverting it to provide a positive-going signal when a black bar has been detected. The output of comparator amplifier 28 is applied to the base terminal of a transistor 128, having a clamping diode 130 connected between its grounded emitter terminal and its base terminal.

The operation of the circuit described above may be clarified with reference to the waveforms (A) through (H) shown in FIG. 5.

Waveform (A) is the analog waveform at the output of the buffer amplifier 12. Waveform (B) represents the voltage at the output of amplifier 108 in slope detector circuit 26. The transitions in this waveform occur where the analog waveform reverses slope or at the positive and negative analog peaks.

Waveform (C) is the transistor switching voltage at output line 118 from the slope detector circuit 26. It is inverted and shifted in level relative to the voltage at the output of amplifier 108 in slope detector circuit 26. Waveforms (D), (E) and (F) are all shown relative to the same zero voltage level. Waveform (D) represents the positive peak at the upper terminal of capacitor 86 in positive peak detector circuit 14. Waveform (F) represents the peak negative voltage at the upper terminal of capacitor 96 in negative peak detector circuit 16. Waveform (E) represents the dual threshold which, in a preferred embodiment, is equal to 25% or 75% of the difference in positive and negative peak voltages, depending upon the slope of the analog signal. Waveform (G) is the voltage at the output of the amplifier 120 in the comparator amplifier circuit 28. This voltage is a square wave representation of the analog signal with the transitions occurring at the points at which the analog signal passes through the threshold levels. Waveform (H), the final output voltage, is inverted and level shifted relative to waveform (G).

As indicated earlier, amplifier 108 is a high gain inverting amplifier which compares the AC component of the analog signal to a reference potential, preferably ground potential. At each negative analog peak, the amplifier 108 switches to a minimum output level dependent upon the forward voltage drop across Zener diode 110. For the preferred type of Zener diode, the amplifier output will be limited to approximately −0.7 volts during periods of positive slope in the analog signal. When the analog signal reaches each positive peak and begins to go negative, the output of amplifier 108 rises sharply until the reverse breakdown voltage of Zener diode 110 is exceeded. The output voltage from amplifier 108 is held at this breakdown voltage, typically on the order of +6 volts, as long as the slope of the analog signal remains negative.

The control signal generated by amplifier 108 must be inverted to drive transistor 38 in the dual threshold circuit. To provide positive switching action, the peak to peak amplitude of the control signal is increased 30 volts. Transistors 112 and 114 perform necessary inversion operations and act as high impedance buffers. Transistor 116 acts as an inverter but also causes the control signal to be driven from a negative peak of −15 volts to a positive peak of +15 volts to produce the transistor switching signal shown in waveform (C).

As indicated earlier, the positive peak detector circuit 14 and the negative peak detector circuit 20 detect the positive and negative peak voltages, respectively in the analog signal and hold those voltages until being reset by the output of comparator amplifier 28. The voltage at the negative input 32 of comparator amplifier 28 is always equal to a percentage of the difference between the positive and negative peak voltages currently being stored in the detector circuits. When transistor 38 is driven into conduction by a positive output from slope detector circuit 26, the voltage at input 32 will represent a lower percentage of the peak difference voltage than when transistor 38 is non-conductive. As indicated earlier, the values of resistors 30, 34 and 36 are preferably selected to provide a threshold value equal to 25% of the peak difference voltage when the analog signal has a positive slope and to 75% of the peak difference voltage when the analog signal has a negative slope.

With reference to waveforms (D), (E) and (F) the threshold voltage waveform is switched from its higher level to its lower level when the slope of the analog signal changes from negative to positive. The comparator amplifier 28 then compares the rising analog signal to the lower threshold voltage. When the lower threshold voltage is exceeded, the output of comparator amplifier 28 is driven to a positive level. This positive-going signal is applied to the reset input of positive peak detector circuit 14 and negative peak detector circuit 16, respectively. More specifically, the positive-going signal is applied to the base terminal of transistor 90 in circuit 14 through a pulse forming capacitor 132 and to the base terminal of transistor 102 in circuit 16 through a similar pulse forming capacitor 134. Transistor 102 is a PNP type transistor which is normally biased into its non-conductive state. The positive-going pulse provided by comparator amplifier 28 does not affect this transistor. The pulse does drive transistor 90 into conduction to at least partially discharge capacitor 86. The time constant established by a capacitor 132 and the associated resistors is such that capacitor 86 is not fully discharged. Capacitor 86 is only discharged to a voltage lower than the minimum positive voltage expected to occur in the system, allowing it to be recharged quickly to the next new positive peak voltage which occurs.

When the analog signal reaches its positive peak and begins to decrease, the output of slope detector 26 abruptly drops to switch transistor 38 into a non-conductive state. The voltage at terminal 32 is then determined solely by the ratios of resistors 30 and 34. As indicated earlier, resistor 34 preferably has three times the impedance of resistor 30 so that the voltage on input 32 to comparator amplifier 28 will rise to 75% of the difference in peak voltages. Since the positive peak detector circuit 14 is reset and allowed to recharge when the positive-going transition is detected, the peak voltages employed in setting the negative-going threshold level are the positive peak voltage from the immediately preceding positive peak and the negative peak voltage from the preceding negative-going analog signal cycle.

The threshold voltage switches from a 25% to a 75% level and back at each change in slope of the input signal.

Waveform (E) shows small excursions which follow the voltages on the holding capacitors each time a reset pulse is applied to one of the peak detector circuits. These small excursions have no impact on the circuit operation since the threshold voltage is established at its new steady state level prior to the time of the next transition.

Waveform (G), the voltage at the output of comparator amplifier 120, generally follows waveform (A) with the transitions in the former waveform occurring at the 25%–75% threshold points in the analog waveform (A). The widths of the rectangular pulses in waveform (G) are equal to the widths of the scanned light and dark bars in the UPC label.

Waveform (H) is produced only where the rectangular pulse stream generated by the circuit is to be 180° out of phase with the analog input waveform and where the output voltages of the signal produced by comparator amplifier 28 must be shifted in order to drive T²L logic elements. Both of the waveforms (G) and (H) have the same information content.

While there has been described what is considered to be a preferred embodiment of the invention, variations and modifications therein will occur to those skilled in the art when they become acquainted with the basic concepts of the invention. Therefore, it is intended that the appended claims shall be construed to include not only the preferred embodiment but all such variations and modifications as fall within the true spirit and scope of the invention.

Having thus described my invention, what I claim as new, and desire to secure by Letters Patent is:

1. For detecting transitions of an input signal between first and second states by comparison of the input signal to first and second adaptively derived threshold voltages, a circuit comprising:

positive and negative peak detector circuits connected to the input signal source, said peak detector circuits providing output signals equal to the positive and negative peak voltages, respectively, of the input signal during two successive cycles, each of said peak detector circuits including a reset input;

a slope detector circuit connected to the input signal source for providing an output voltage having a first value for positive slopes and a second value for negative slopes;

an adaptive threshold-establishing circuit having a first input from said positive peak detector circuit, a second input from said negative peak detector circuit and a common output, said threshold-establishing circuit including a first impedance connecting said first input to said common output, a second impedance connecting said second input to said common output and means responsive to the value of the output from said slope detector circuit for changing the effective value of one of said impedances;

comparator means connected to the input signal source and to the common output of said threshold-establishing circuit, said comparator means providing an output having a first state when the input signal is greater than the signal on the common output and a second state when the input signal is less than the signal on the common output; and means for applying the output of said comparator means to the reset inputs of said peak detector circuits to reset each peak detector whenever the comparator output changes to a state corresponding to the output of the peak detector to be reset.

2. A circuit as defined in claim 1, wherein said slope detector circuit includes a high gain amplifier having a first input connected to the input signal source through a DC blocking capacitor and a second input connected to a reference voltage source.

3. A circuit as defined in claim 2, wherein said second impedance in said adaptive threshold circuit has first and second branches connecting the second input to the common output, said first branch comprising a first resistor and said second branch comprising the series combination of a second resistor and a controllable switching device, said switching device being controlled by the output of said slope detector circuit.

4. A circuit as defined in claim 3, wherein the relative values of said first impedance, said first resistor and said second resistor are selected to provide an output voltage exceeding the peak negative voltage by an absolute amount greater than ½ of the difference between the peak output voltages when said switching device is in one state and an output voltage exceeding the peak negative voltage by an absolute amount less than ½ the difference between peak negative voltages when said switching device is in its other state.

5. A circuit as defined in claim 4, wherein the output of said adaptive threshold circuit exceeds the peak negative voltage by 90% to 60% of the peak voltage difference when said switching device is in one state and exceeds the peak negative voltage by 40% to 10% of the peak voltage difference when said switching device is in the other state.

6. A circuit as defined in claim 5, wherein the output of said threshold-establishing circuit exceeds the peak negative voltage by 75% of the peak voltage difference or 25% of the peak voltage difference, depending upon the state of said switching device.

7. A circuit as defined in claim 5, wherein the impedance of said second resistor is less than the impedance of said first resitor.

8. A method of adapting threshold values for detecting transitions of an input signal between first and second states comprising the steps of:
- determining positive and negative peak voltages during two successive cycles of an input signal;
- detecting the polarity of the slope of the input signal;
- establishing a first threshold value nearer the determined negative peak voltage when the detected slope has one polarity;
- establishing a second threshold value nearer the positive peak voltage when the detected slope has the other polarity;
- comparing the input signal level to the first and second threshold values during successive cycles to produce an output signal having one state when an input signal having a slope of the one polarity exceeds the first threshold value and another state when an input signal having a slope of the other polarity falls below the second threshold value.

9. A method as defined in claim 8 including the further step of determining new positive and negative peak voltages for each succeeding pair of input signal cycles.

10. A method as defined in claim 9, wherein the first threshold value exceeds the peak negative value by an amount equal to 40% to 10% of the peak voltage difference while the second threshold value exceeds the peak negative voltage by an amount equal to 90% to 60% of the peak voltage difference.

11. A method as defined in claim 10, wherein the first threshold value exceeds the peak negative voltage by an amount on the order of 25% of the difference in peak voltages while the second threshold value exceeds the peak negative voltage by an amount on the order of 75% of the difference in established peak voltages.

* * * * *